(12) United States Patent
Shan et al.

(10) Patent No.: US 11,736,107 B2
(45) Date of Patent: Aug. 22, 2023

(54) FIELD-PROGRAMMABLE GATE ARRAY (FPGA) FOR USING CONFIGURATION SHIFT CHAIN TO IMPLEMENT MULTI-BITSTREAM FUNCTION

(71) Applicant: WUXI ESIONTECH CO., LTD., Wuxi (CN)

(72) Inventors: Yueer Shan, Wuxi (CN); Yanfeng Xu, Wuxi (CN); Xiaofei He, Wuxi (CN); Jicong Fan, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 120 days.

(21) Appl. No.: 17/645,456

(22) Filed: Dec. 22, 2021

(65) Prior Publication Data
US 2022/0116040 A1    Apr. 14, 2022

Related U.S. Application Data

(63) Continuation of application No. PCT/CN2021/128353, filed on Nov. 3, 2021.

(30) Foreign Application Priority Data

Aug. 19, 2021  (CN) .......................... 202110953834.4

(51) Int. Cl.
*H03K 19/173*    (2006.01)
*H03K 3/037*    (2006.01)

(52) U.S. Cl.
CPC ........... *H03K 19/173* (2013.01); *H03K 3/037* (2013.01)

(58) Field of Classification Search
CPC ............. H03K 19/173; H03K 19/1737; H03K 19/1776; H03K 3/037; H03K 5/15093;
(Continued)

(56) References Cited

U.S. PATENT DOCUMENTS 5,596,743 A    1/1997 Bhat et al.
10,541,686 B1 *    1/2020 Schultz ............ H03K 19/17756
(Continued)

FOREIGN PATENT DOCUMENTS

CN    102866865 A    1/2013
CN    111725188 A    9/2020
(Continued)

*Primary Examiner* — Jason Crawford
(74) *Attorney, Agent, or Firm* — Bayramoglu Law Offices LLC

(57) ABSTRACT

A field-programmable gate array (FPGA) for using a configuration shift chain to implement a multi-bitstream function includes a bitstream control circuit, a multi-bitstream configuration shift chain and a configurable module. The FPGA enables multi-bitstream storage configuration bits to latch configuration bitstreams by adjusting a circuit structure of a multi-bitstream configuration shift chain in a combination of a control logic of a bitstream control circuit for the multi-bitstream configuration shift chain, and outputs one latched configuration bitstream from a configuration output terminal to a configurable module through each multi-bitstream storage configuration bit as required, so that the configurable module implements a logic function corresponding to the configuration bitstream outputted by the multi-bitstream configuration shift chain. By switching output of different configuration bitstreams, the FPGA can perform a plurality of times of high-speed switching to implement different logic functions without downloading bitstreams from an off-chip.

18 Claims, 4 Drawing Sheets

(58) Field of Classification Search
CPC ......... H03K 5/1502; G06F 30/34; G06F 5/08; G06F 3/007
See application file for complete search history.

(56) References Cited

U.S. PATENT DOCUMENTS

| | | | |
|---|---|---|---|
| 2016/0141009 A1* | 5/2016 | Cho | G06F 9/30105 711/109 |
| 2018/0275193 A1* | 9/2018 | Rouge | G01R 31/31701 |
| 2019/0227120 A1* | 7/2019 | Rouge | G01R 31/28 |
| 2022/0116040 A1* | 4/2022 | Shan | H03K 19/173 |

FOREIGN PATENT DOCUMENTS

| | | |
|---|---|---|
| CN | 111755436 A | 10/2020 |
| CN | 112004291 A | 11/2020 |

\* cited by examiner

FIELD-PROGRAMMABLE GATE ARRAY (FPGA) FOR USING CONFIGURATION SHIFT CHAIN TO IMPLEMENT MULTI-BITSTREAM FUNCTION

CROSS REFERENCE TO THE RELATED APPLICATIONS

This application is the continuation application of International Application No. PCT/CN2021/128353, filed on Nov. 3, 2021, which is based upon and claims priority to Chinese Patent Application No. 202110953834.4, filed on Aug. 19, 2021, the entire contents of which are incorporated herein by reference.

TECHNICAL FIELD

The present invention relates to the field of field-programmable gate array (FPGA) technologies, and more particularly, to an FPGA for using a configuration shift chain to implement a multi-bitstream function.

BACKGROUND

With the development of very large-scale integration circuits, FPGA chips have been used more widely due to excellent interface performance, rich logics and IP resources, as well as a flexible and convenient field-programmable capability.

The FPGA chip has a configurable module and a wiring resource. When being mapped to the FPGA chip, a user design may determine, by defining the configuration content (the content of a configuration bit), a function implemented by the configurable module and a wiring path selected by the wiring resource in the FPGA chip, so as to define a function implemented by the FPGA chip. An FPGA design software maps a user design input after being subjected to synthesis, layout and wiring to the FPGA chip, and then generates a bitstream file in a predetermined format according to the used configuration content of the configurable module and the wiring resource. Bitstreams can be filled in the configuration content correctly after being downloaded into an FPGA device, and the function of the FPGA chip can be defined. To maintain the correctness of a circuit of the FPGA, before the FPGA is started, the content of the configuration bit is separated from a configured module temporarily, to avoid circuit damage caused by a circuit conflict (for example, a short circuit and a large current) due to incomplete configuration during downloading. When the bitstreams are downloaded and after all bitstream data is written into the configuration bit, the bitstream data in all the configuration bits are enabled to be used to configure each configured module, so that a function of the user design can be implemented by running the FPGA chip. If the FPGA chip needs to switch to implement a function of another user design, bitstreams need to be re-downloaded from an off-chip, and the FPGA chip is restarted and runs after passing through the process. This leads to a long time-consuming process when the FPGA chip switches to implement functions of different user designs, and the FPGA chip is difficult to be applied to a scenario in which the functions of the user designs need to be switched at high speed or frequently.

SUMMARY

Technical Problem

If the FPGA chip needs to switch to implement a function of another user design, bitstreams need to be re-downloaded from an off-chip, and the FPGA chip is restarted and runs after passing through the process. This leads to a long time-consuming process when the FPGA chip switches to implement functions of different user designs, and the FPGA chip is difficult to be applied to a scenario in which the functions of the user designs need to be switched at high speed or frequently.

Solutions to the Problem

Technical Solution

In view of the problem and technical requirements, the inventor proposes an FPGA for using a configuration shift chain to implement a multi-bitstream function, and a technical solution of the present invention is as follows.

An FPGA for using a configuration shift chain to implement a multi-bitstream function is provided, the FPGA including a bitstream control circuit, a multi-bitstream configuration shift chain and a configurable module, where the multi-bitstream configuration shift chain includes a plurality of multi-bitstream storage configuration bits, and the multi-bitstream storage configuration bits are sequentially cascaded through a shift write-in terminal and a shift write-out terminal; each multi-bitstream storage configuration bit comprises a shift register, an output latch and an input multiplexer; an output terminal of the input multiplexer is connected to an input terminal of the shift register, and an output terminal of the shift register is connected to an input terminal of the output latch and the shift write-out terminal of the multi-bitstream storage configuration bit; an output terminal of the output latch is connected to a configuration output terminal of the multi-bitstream storage configuration bit, and the configuration output terminal is configured to be connected to a corresponding configurable module; an input terminal of the input multiplexer is connected to the shift write-in terminal of the multi-bitstream storage configuration bit and the output terminal of the output latch; and the bitstream control circuit respectively writes at least two configuration bitstreams into each multi-bitstream storage configuration bit through the multi-bitstream configuration shift chain, the bitstream control circuit respectively latches the at least two configuration bitstreams into the shift register and the output latch by controlling working states of devices in each multi-bitstream storage configuration bit, and the multi-bitstream configuration shift chain outputs one of the latched configuration bitstreams to the configurable module from the configuration output terminal through each multi-bitstream storage configuration bit, so that the configurable module implements a logic function corresponding to the configuration bitstream outputted by the multi-bitstream configuration shift chain, and logic functions corresponding to the configuration bitstreams are different.

A further technical solution thereof is that the multi-bitstream storage configuration bit includes one output latch, an output terminal of the output latch is directly connected to a configuration output terminal of the multi-bitstream storage configuration bit, the multi-bitstream storage configuration bit outputs one configuration bitstream latched in the output latch, and the bitstream control circuit switches the output of different configuration bitstreams by adjusting a latch state of each configuration bitstream.

A further technical solution thereof is that an input terminal of the output latch is directly connected to the output terminal of the shift register, the output terminal of the output latch is directly connected to the input terminal of the shift register by the input multiplexer, and two configuration bitstreams are latched in the multi-bitstream storage configuration bit.

A further technical solution thereof is that the multi-bitstream storage configuration bit includes P output latches, and one configuration bitstream is latched in each output latch; the multi-bitstream storage configuration bit further includes an output multiplexer, and output terminals of the P output latches are respectively connected to input terminals of the output multiplexer; an output terminal of the output multiplexer is connected to the configuration output terminal of the multi-bitstream storage configuration bit, and the multi-bitstream storage configuration bit outputs one configuration bitstream latched in one of the output latches; and the bitstream control circuit switches output of different configuration bitstreams by adjusting a latch state of each configuration bitstream and/or adjusting the on state of the output multiplexer, where $P \geq 2$.

A further technical solution thereof is that the P output latches form a plurality of latch paths, the plurality of latch paths are connected to two terminals of the shift register to form closed loops, and each latch path includes one output latch or a plurality of output latches connected in series.

A further technical solution thereof is that the multi-bitstream storage configuration bit further includes M intermediate latches, an input terminal of each intermediate latch is connected to the output terminal of the shift register, an output terminal of each intermediate latch is connected to the input terminal of the shift register, one configuration bitstream is respectively latched in the shift register and all the latches, and all the latches comprise all the output latches and all the intermediate latches; and A further technical solution thereof is that all the latches form one or more latch paths, the one or more latch paths are connected to two terminals of the shift register to form closed loops, each latch path includes one output latch or a plurality of output latches connected in series, and a latch on each latch path includes an output latch and/or an intermediate latch.

A further technical solution thereof is that the bitstream control circuit controls the multi-bitstream storage configuration bit to switch the output of different configuration bitstreams at a predetermined time interval or when receiving a predetermined signal.

A further technical solution thereof is that the predetermined signal comes from the outside of the FPGA or from the inside of the FPGA.

A further technical solution thereof is that when the predetermined signal comes from the outside of the FPGA, the bitstream control circuit obtains the predetermined signal through a boundary scan circuit.

A further technical solution thereof is that the shift register includes a first latch and a second latch, an input terminal of the first latch is used as the input terminal of the shift register, an output terminal of the first latch is connected to an input terminal of the second latch, an output terminal of the second latch is used as the output terminal of the shift register, and one configuration bitstream latched in the shift register is latched in both the first latch and the second latch; and the bitstream control circuit controls the shift register and latches in a closed loop of the shift register to perform mutual writing and overwriting of the configuration bitstreams according to a predetermined sequence, to adjust a latch state of each configuration bitstream.

A further technical solution thereof is that write-in controllers are respectively connected among latches connected with each other, each write-in controller is controlled by the bitstream control circuit, the bitstream control circuit controls a writing and overwriting process between the latches by controlling the on state of each write-in controller, and only one write-in controller is turned on at the same time at most.

A further technical solution thereof is that when the configuration bitstream outputted by the multi-bitstream storage configuration bit is switched, the FPGA directly runs another logic function according to a switched configuration bitstream, or after being re-started, the FPGA runs another logic function according to a switched configuration bitstream.

A further technical solution thereof is that logic functions corresponding to two configuration bitstreams outputted by the multi-bitstream storage configuration bit before and after switching respectively belong to different user designs and are independent from each other, and when the FPGA switches running of a logic function corresponding to the other configuration bitstream after being re-started, user data stored in an on-chip storage resource inside the FPGA is reset to a default value during switching.

A further technical solution thereof is that logic functions corresponding to two configuration bitstreams outputted by the multi-bitstream storage configuration bit before and after switching belong to different parts of an identical user design and have data transmission paths, and when the FPGA switches running of logic functions corresponding to different configuration bitstreams, user data stored in an on-chip storage resource inside the FPGA remains unchanged.

A further technical solution thereof is that when the FPGA runs a logic function corresponding to one configuration bitstream latched in the output latch, the bitstream control circuit writes, through the configuration shift chain, a new configuration bitstream to cover another configuration bitstream latched in the multi-bitstream storage configuration bit.

A further technical solution thereof is that all configuration shift chains in the FPGA are the multi-bitstream configuration shift chain; or some configuration shift chains are the multi-bitstream configuration shift chain, the remaining configuration shift chains are a single-bitstream configuration shift chain, and one configuration bitstream is latched in a single-bitstream storage configuration bit in the single-bitstream configuration shift chain.

The Advantage of the Present Invention

Advantage

This application provides an FPGA for using a configuration shift chain to implement a multi-bitstream function. The FPGA enables multi-bitstream storage configuration bits to latch configuration bitstreams by adjusting a circuit structure of a multi-bitstream configuration shift chain in combination of a control logic of a bitstream control circuit for the multi-bitstream configuration shift chain, and outputs one latched configuration bitstream from a configuration output terminal to a configurable module through each multi-bitstream storage configuration bit as required, so that the configurable module implements a logic function corresponding to the configuration bitstream outputted by the multi-bitstream configuration shift chain. By switching output of different configuration bitstreams, the FPGA can perform a plurality of times of high-speed switching to implement different logic functions without downloading bitstreams from an off-chip.

Logic functions implemented by the FPGA before and after switching may not only belong to two independent user designs, but also belong to different parts of an identical user design, which is very suitable for the FPGA to implement a scenario of ultra-capacity user design.

BRIEF DESCRIPTION OF THE DRAWINGS

Description of the Drawings

Figure 1:
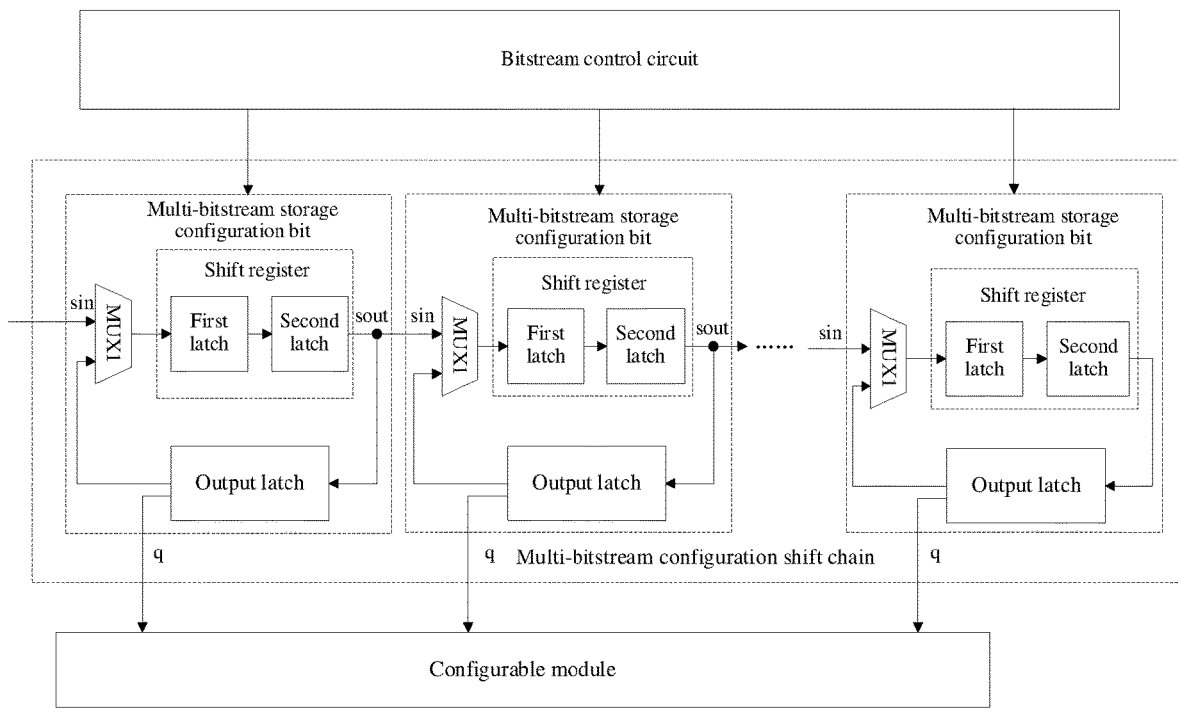

FIG. 1 is a schematic structural diagram of an internal structure of an FPGA according to the present application.

Figure 2:
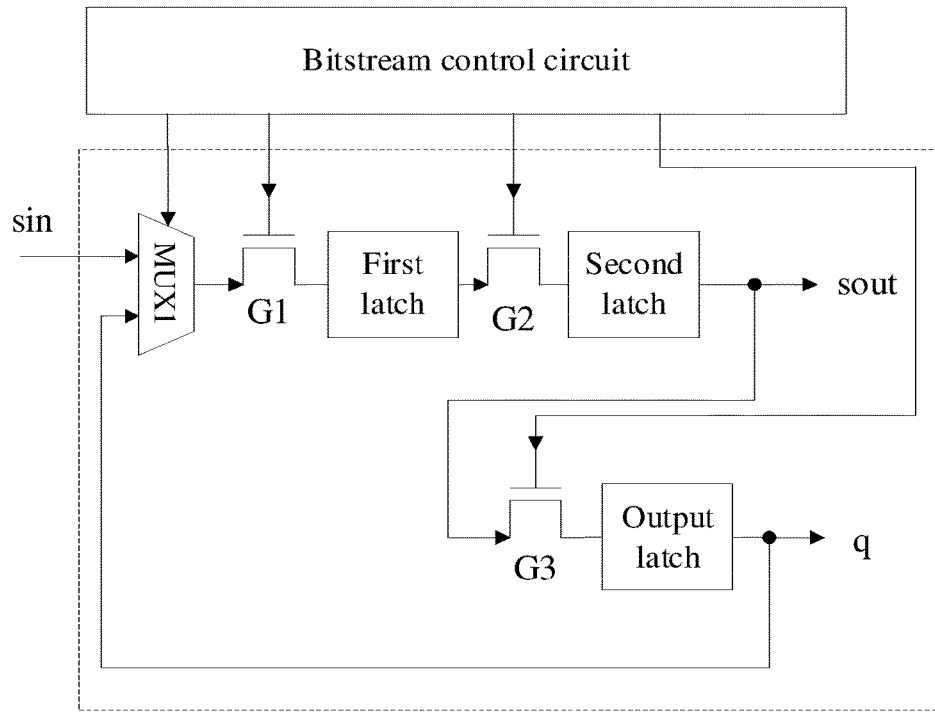

FIG. 2 is a schematic diagram of connection and control between a bitstream control circuit and one multi-bitstream storage configuration bit according to a first embodiment.

Figure 3:
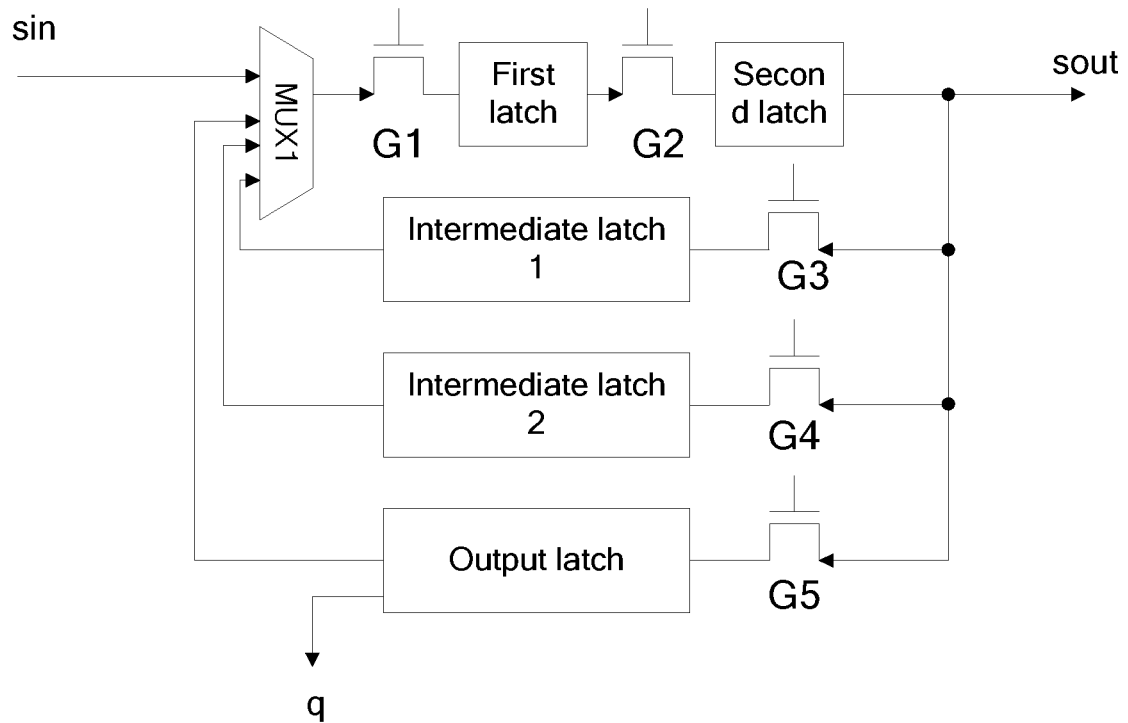

FIG. 3 is a schematic diagram of an implementation of a multi-bitstream storage configuration bit according to a second embodiment.

Figure 4:
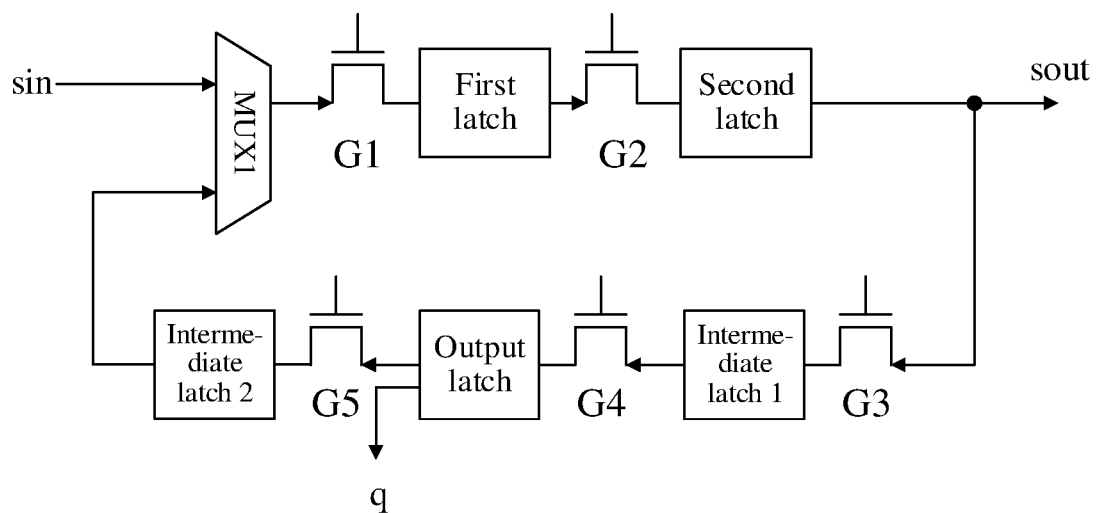

FIG. 4 is a schematic diagram of another implementation of a multi-bitstream storage configuration bit according to a second embodiment.

Figure 5:
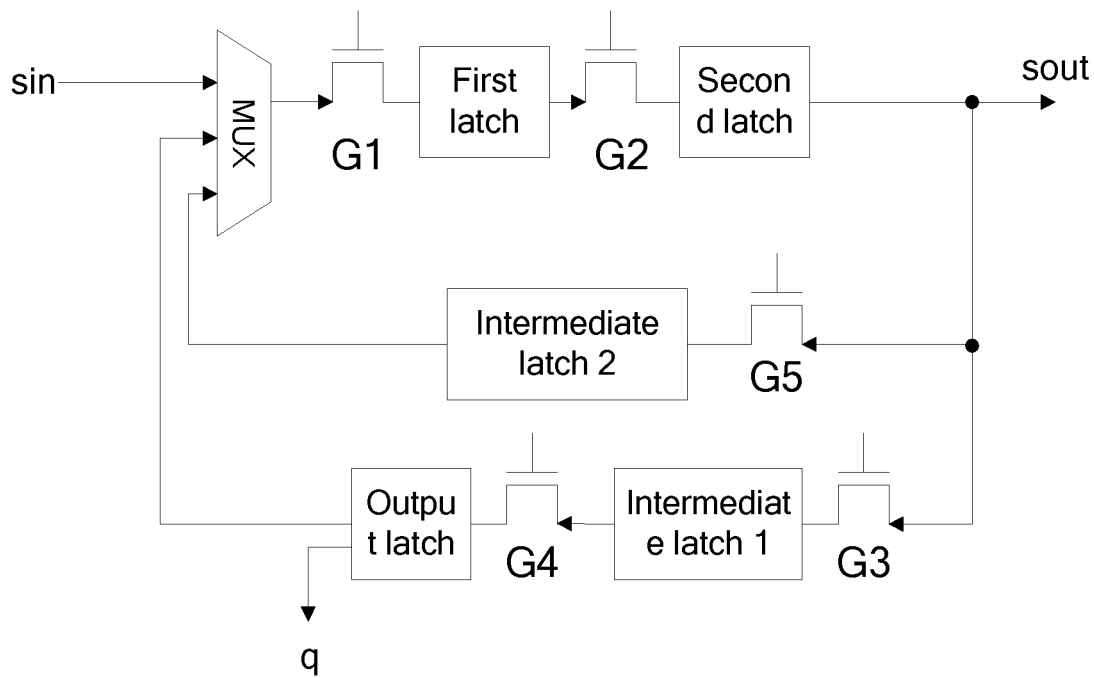

FIG. 5 is a schematic diagram of still another implementation of a multi-bitstream storage configuration bit according to a second embodiment.

Figure 6:
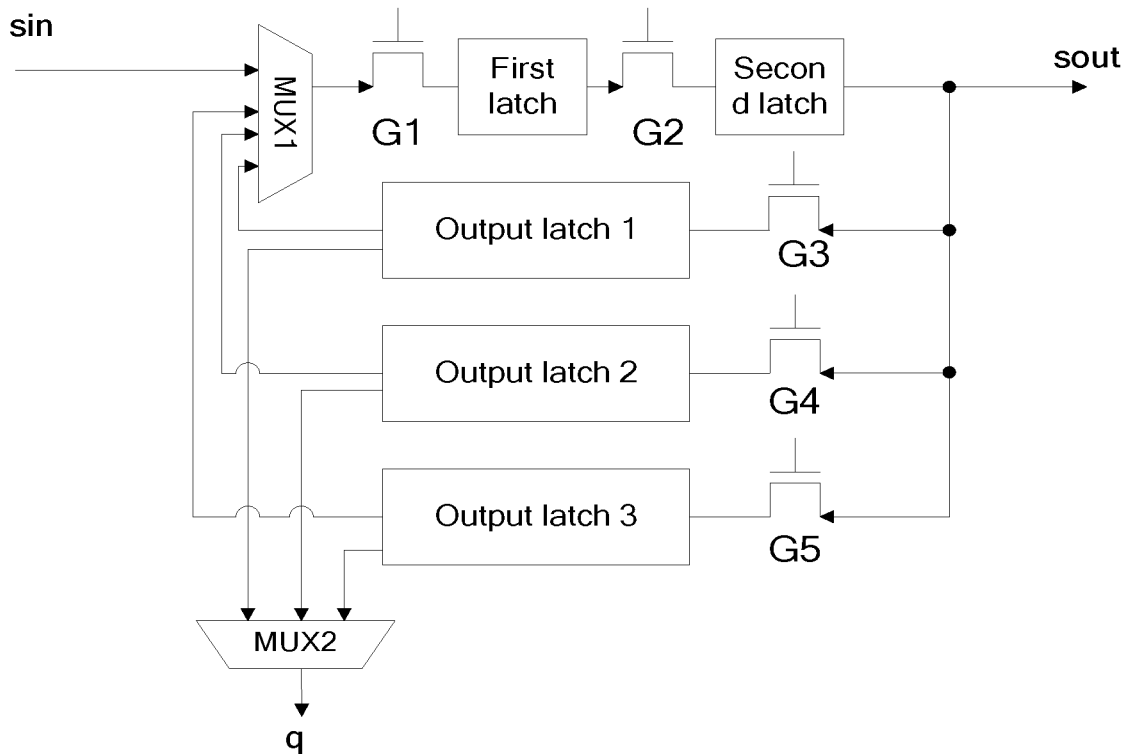

FIG. 6 is a schematic diagram of an implementation of a multi-bitstream storage configuration bit according to a third embodiment.

Figure 7:
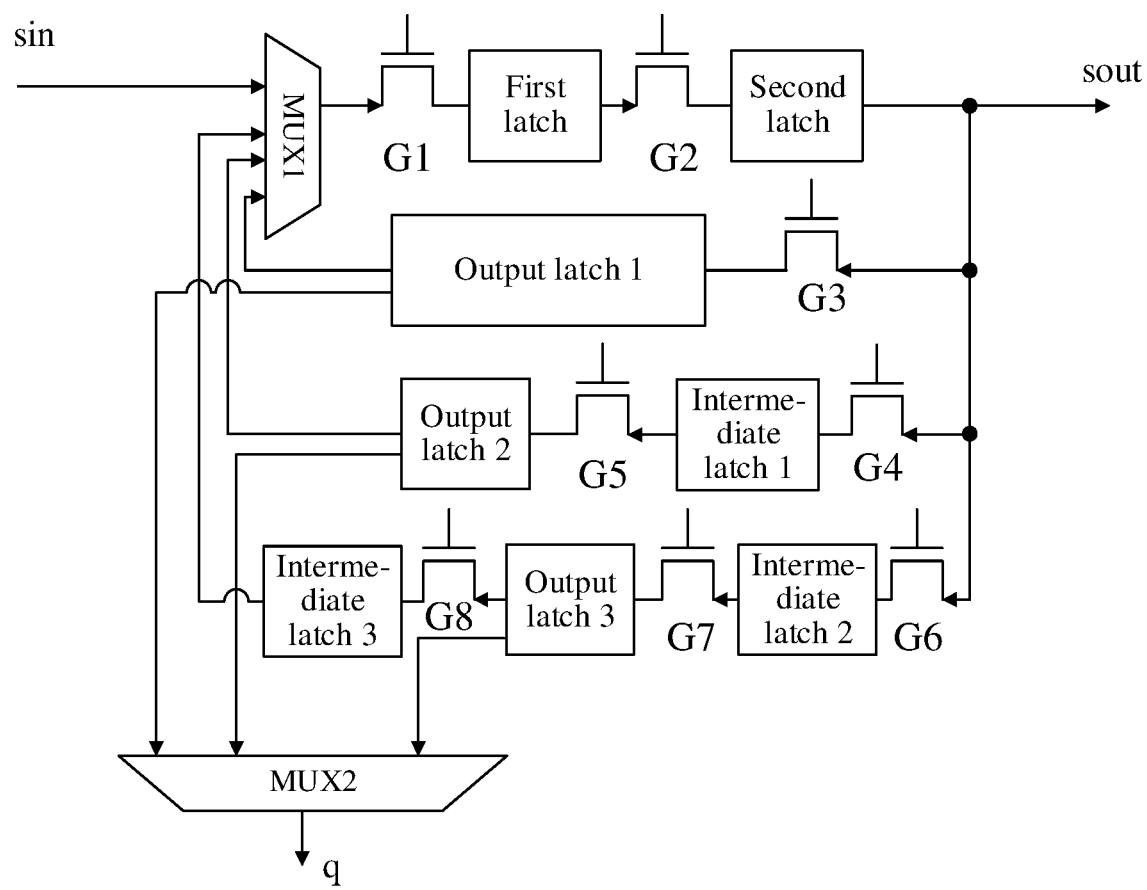

FIG. 7 is a schematic diagram of an implementation of a multi-bitstream storage configuration bit according to a fourth embodiment.

DETAILED DESCRIPTION OF THE EMBODIMENTS

Implementations of the Present Invention

The specific embodiments of the present invention will be further described with reference to the accompanying drawings.

This present application provides an FPGA for using a configuration shift chain to implement a multi-bitstream function. Referring to FIG. 1, the FPGA includes a bitstream control circuit, a multi-bitstream configuration shift chain and a configurable module. The multi-bitstream configuration shift chain includes a plurality of multi-bitstream storage configuration bits, and the multi-bitstream storage configuration bits are sequentially cascaded through a shift write-in terminal sin and a shift write-out terminal sout, i.e., sin of each level of multi-bitstream storage configuration bit is connected to sout of a previous level of multi-bitstream storage configuration bit, and sout of each level of multi-bitstream storage configuration bit is connected to sin of a next level of multi-bitstream storage configuration bit. sin of a first level of multi-bitstream storage configuration bit is configured to obtain a configuration bitstream, and sout of a lastest level of multi-bitstream storage configuration bit may be considered as suspended.

Each multi-bitstream storage configuration bit includes a shift register, an output latch and an input multiplexer MUX1. An output terminal of the input multiplexer MUX1 is connected to an input terminal of the shift register, an output terminal of the shift register is connected to an input terminal of the output latch and sout of the multi-bitstream storage configuration bit, and an output terminal of the output latch is connected to a configuration output terminal q of the multi-bitstream storage configuration bit. An input terminal of the input multiplexer MUX1 is connected to sin of the multi-bitstream storage configuration bit and the output terminal of the output latch.

The bitstream control circuit respectively writes at least two configuration bitstreams into each multi-bitstream storage configuration bit through the multi-bitstream configuration shift chain, the bitstream control circuit respectively latches the at least two configuration bitstreams in the shift register and the output latch by controlling working states of devices in each multi-bitstream storage configuration bit, and the multi-bitstream configuration shift chain outputs one of the latched configuration bitstreams to the configurable module from the configuration output terminal q through each multi-bitstream storage configuration bit, so that the configurable module implements a logic function corresponding to the configuration bitstream outputted by the multi-bitstream configuration shift chain, and logic functions corresponding to configuration bitstreams are different.

To implement shift, the shift register includes a first latch and a second latch. An input terminal of the first latch is used as the input terminal of the shift register, an output terminal of the first latch is connected to an input terminal of the second latch, and an output terminal of the second latch is used as the output terminal of the shift register. In a stable state, one configuration bitstream latched by the shift register is latched in both the first latch and the second latch. The following embodiments are described based on a structure in which the shift register includes the first latch and the second latch.

In a first embodiment, as shown in FIG. 1, the multi-bitstream storage configuration bit includes one output latch, and an output terminal of the output latch is directly connected to a configuration output terminal q of the multi-bitstream storage configuration bit. In this embodiment, an input terminal of the output latch is directly connected to an output terminal of the shift register, and the output terminal of the output latch is directly connected to an input terminal of the shift register by an input multiplexer MUX1. In this case, the output latch is connected to two terminals of the shift register to form a closed loop. In this embodiment, two configuration bitstreams are latched in the multi-bitstream storage configuration bit, one configuration bitstream is latched in the shift register, and the other configuration bitstream is latched in the output latch.

When respectively writing two configuration bitstreams into each multi-bitstream storage configuration bit through the multi-bitstream configuration shift chain, the bitstream control circuit first writes a configuration bitstream 1 into the shift register in each multi-bitstream storage configuration bit sequentially through a cascade structure in the multi-bitstream configuration shift chain, and then the shift register writes the configuration bitstream 1 into the output latch. Subsequently, the bitstream control circuit writes a configuration bitstream 2 into the shift register in each multi-bitstream storage configuration bit sequentially through the cascade structure in the multi-bitstream configuration shift chain again to cover the configuration bitstream 1, thereby implementing latch of the two configuration bitstreams.

The multi-bitstream storage configuration bit outputs one configuration bitstream latched in the output latch, and the bitstream control circuit switches output of different configuration bitstreams by adjusting a latch state of each configuration bitstream. To be specific, the bitstream control circuit outputs different configuration bitstreams by switching the configuration bitstream latched in the output latch. For example, when the configuration bitstream 2 is latched in the shift register and the configuration bitstream 1 is latched in the output latch, the multi-bitstream storage configuration bit outputs the configuration bitstream 1, and when the bitstream control circuit adjusts that the configuration bitstream 2 is latched in the output latch and the configuration bitstream 1 is latched in the shift register, the multi-bitstream storage configuration bit outputs the configuration bitstream 2.

The bitstream control circuit controls the shift register and latches in the closed loop of the shift register to perform mutual writing and overwriting of the configuration bitstreams according to a predetermined sequence, to adjust the latch state of each configuration bitstream. Specifically, write-in controllers are respectively connected among the latches connected with each other, which includes: a write-in controller is connected between any two connected latches of the first latch, the second latch, and the output latch. It is ensured through a bottom circuit design that when the write-in controller is turned on, content in the latch may be changed through data written into the latch through the write-in controller.

Each write-in controller is controlled by the bitstream control circuit. The bitstream control circuit controls the on state of each write-in controller according to a predetermined sequence to control a writing and overwriting process between the latches, and only one write-in controller is turned on at the same time at most. A specific turn-on sequence of each write-in controller is related to a connection relationship between the latches and a latch state of a to-be-implemented configuration bitstream, which cannot be listed exhaustively in the present application. A person skilled in the art can implement a required writing and overwriting process based on an actual requirement with reference to different embodiments of the present application. In this embodiment, for a connection and control structure of the bitstream control circuit for one multi-bitstream storage configuration bit, reference is made to FIG. 2. A write-in controller G1 is connected between the output latch and the first latch. Specifically, the write-in controller G1 is connected between the output terminal of the input multiplexer MUX1 and the first latch. A write-in controller G2 is connected between the first latch and the second latch, a write-in controller G3 is connected between the second latch and the output latch, and the write-in controllers G1, G2, and G3 and the input multiplexer MUX1 are all controlled by the bitstream control circuit. On times of the three write-in controllers do not overlap, to ensure that only one of the three latches can be written at the same time.

A high enable of the write-in controller is used as an example, and writing and adjustment of a latch state of a configuration bitstream are described below with reference to FIG. 2.

(1) A configuration bitstream writing and download process: The bitstream control circuit controls an input multiplexer in each multi-bitstream storage configuration bit to be gating and connected to the shift write-in terminal and controls G1 in a first level of multi-bitstream storage configuration bit to be turned on, and the configuration bitstream 1 enters the first latch from the shift write-in terminal and is latched in the first latch, and when G1 is controlled to be turned off and G2 is controlled to be turned on, the configuration bitstream 1 is shifted to the second latch from the first latch and is written into and latched in the second latch, and G2 is turned off. When G1 in a second level of multi-bitstream storage configuration bit is controlled to be turned on, the configuration bitstream 1 enters a first latch from the previous level of multi-bitstream storage configuration bit through a shift write-in terminal and is latched in the first latch, and so on until the configuration bitstream 1 is latched in a second latch in a lastest level of multi-bitstream storage configuration bit, i.e., G1 and G2 in each multi-bitstream storage configuration bit are turned on sequentially according to the cascade structure until the configuration bitstream 1 fills all the shift registers. Subsequently, the bitstream control circuit controls G3 in all the multi-bitstream storage configuration bits to be turned on, the configuration bitstream 1 in the second latches is written into and latched in the output latches. Subsequently, the bitstream control circuit turns on G1 and G2 in the multi-bitstream storage configuration bits sequentially again according to the control method until the configuration bitstream 2 fills all the shift registers, so that the configuration bitstream 2 is latched in each shift register, and two configuration bitstreams are downloaded and written.

(2) An adjustment process of a latch state of a configuration bitstream: After the writing is completed, the configuration bitstream 1 is latched in each output latch and the configuration bitstream 2 is latched in each shift register, i.e., the configuration bitstream 2 is latched in each first latch and each second latch simultaneously. Based on this, the bitstream control circuit controls an input multiplexer in each multi-bitstream storage configuration bit to be gating and connected to the output latch. First, G1 is controlled to be turned on, so that the configuration bitstream 1 latched in the output latch is written into the first latch to cover the configuration bitstream 2. In this case, the configuration bitstream 1 is latched in the first latch and the output latch, and the configuration bitstream 2 is latched in the second latch. G1 is turned off and G3 is turned on, so that the configuration bitstream 2 in the second latch is written into the output latch to cover the configuration bitstream 1. In this case, the configuration bitstream 2 is latched in the second latch and the output latch and the configuration bitstream 1 is latched in the first latch. G3 is turned off and G2 is turned on, so that the configuration bitstream 1 in the first latch is written into the second latch to cover the configuration bitstream 2, and so far, a stable state is returned. The configuration bitstream 1 is latched in both the first latch and the second latch and the configuration bitstream 2 is latched in the output latch, to adjust the latch state of each configuration bitstream.

This embodiment is a relatively commonly used embodiment in an actual application, and a structure in this embodiment has a relatively small change for a circuit structure compared with a structure in an existing FPGA, and can cause the FPGA to implement a dual-bitstream function according to a control logic of the bitstream control circuit and implement high-speed switching between two logic functions for a plurality of times without re-downloading a bitstream from an off-chip.

In a second embodiment, same as the first embodiment, the multi-bitstream storage configuration bit also includes one output latch, and an output terminal of the output latch is directly connected to a configuration output terminal q of the multi-bitstream storage configuration bit. However, different from the first embodiment, the multi-bitstream storage configuration bit further includes M intermediate latches in addition to including the shift register and the output latch. An input terminal of each intermediate latch is connected to the output terminal of the shift register, and an output terminal of each intermediate latch is connected to the input terminal of the shift register.

All the latches form one or more latch paths, the one or more latch paths are connected to two terminals of the shift register to form closed loops, each latch path includes one or more latches connected in series, and a latch on each latch path includes an output latch and/or an intermediate latch. Each latch path is connected to the shift register by different input terminals of the input multiplexer. In this embodiment, the input multiplexer MUX1 may be a multi-input-terminal multiplexer or may be a cascade structure formed by a plurality of multi-input-terminal multiplexers. One configuration bitstream is respectively latched in the shift register and all the latches, all the latches include all the output latches and all the intermediate latches, and a total of M+2 configuration bitstreams are latched in the multi-bitstream storage configuration bits.

There are a plurality of implementations for the latch path formed by the output latch and the intermediate latch at two terminals of the shift register. For example, two intermediate latches are included, three latches may respectively form three latch paths, and the three latch paths are connected to the two terminals of the shift register, as shown in FIG. 3. Alternatively, three latches may be connected in series to form one latch path, and the latch path is connected to the two terminals of the shift register, as shown in FIG. 4. Alternatively, an intermediate latch 1 is connected to the output latch in series according to a data transmission path to form one latch path, and an intermediate latch 2 form one latch path alone, as shown in FIG. 5. FIG. 3 to FIG. 5 show only several possible implementations. Actually, there are further a plurality of formed possible implementations, and when a plurality of latches are connected in series, a plurality of different series combination sequences also exist between the latches, for example, in FIG. 4, a structure in which intermediate latch 1-output latch-intermediate latch 2 are connected in series according to the data transmission path, or the structure may be modified into a structure in which output latch-intermediate latch 1-intermediate latch 2 are connected in series according to the data transmission path and another serial structure.

The second embodiment may be considered as a further extended embodiment of the first embodiment. Similar to a working process in the first embodiment, the bitstream control circuit writes different configuration bitstreams into the latches through the shift register and performs mutual writing and overwriting of the configuration bitstreams by controlling the shift register and the latches in the closed loop of the shift register according to a predetermined sequence, to adjust the latch state of each configuration bitstream. write-in controllers are respectively connected among the latches connected with each other, and each write-in controller is controlled by the bitstream control circuit. The bitstream control circuit controls a writing and overwriting process between the latches by controlling the on state of each write-in controller, and only one write-in controller is turned on at the same time at most. In this embodiment, the latches connected with each other include the first latch, the second latch, the output latch, and the intermediate latch.

A structure shown in FIG. 5 is used as an example, and writing and adjustment of a latch state of the configuration bitstream are described below.

(1) A configuration bitstream writing and download process: The bitstream control circuit controls an input multiplexer in each multi-bitstream storage configuration bit to be gating and connected to the shift write-in terminal and controls G1 in a first level of multi-bitstream storage configuration bit to be turned on, and the configuration bitstream 1 enters the first latch from the shift write-in terminal and is latched in the first latch, and when G1 is controlled to be turned off and G2 is controlled to be turned on, the configuration bitstream 1 is shifted to the second latch from the first latch and is written into and latched in the second latch, and G2 is turned off. When G1 in a second level of multi-bitstream storage configuration bit is controlled to be turned on, the configuration bitstream 1 enters a first latch from the previous level of multi-bitstream storage configuration bit through a shift write-in terminal and is latched in the first latch, and so on until the configuration bitstream 1 is latched in a second latch in a lastest level of multi-bitstream storage configuration bit, i.e., G1 and G2 in each multi-bitstream storage configuration bit are turned on sequentially according to the cascade structure until the configuration bitstream 1 fills all the shift registers.

Subsequently, when the bitstream control circuit controls G3 in all the multi-bitstream storage configuration bits to be turned on, the configuration bitstream 1 in the second latches is written into and latched in the intermediate latch 1. When G3 is turned off and G4 is turned on, the configuration bitstream 1 in the intermediate latch 1 is written into and latched in the output latch.

Subsequently, the bitstream control circuit turns on G1 and G2 in the multi-bitstream storage configuration bits sequentially again according to the control method until the configuration bitstream 2 fills all the shift registers. Subsequently, the bitstream control circuit controls G3 in all the multi-bitstream storage configuration bits to be turned on, the configuration bitstream 2 in the second latches is written into and latched in the intermediate latch 1.

Subsequently, the bitstream control circuit turns on G1 and G2 in the multi-bitstream storage configuration bits sequentially again according to the control method until a configuration bitstream 3 fills all the shift registers. Subsequently, when the bitstream control circuit controls G5 in all the multi-bitstream storage configuration bits to be turned on, the configuration bitstream 3 in the second latches is written into and latched in the intermediate latch 2.

Subsequently, the bitstream control circuit turns on G1 and G2 in the multi-bitstream storage configuration bits sequentially again according to the control method until a configuration bitstream 4 fills all the shift registers. So far, four configuration bitstreams are downloaded and latched.

(2) An adjustment process of a latch state of a configuration bitstream: After the writing is completed, the configuration bitstream 1 is latched in each output latch, the configuration bitstream 2 is latched in the intermediate latch 1, the configuration bitstream 3 is latched in the intermediate latch 2, and the configuration bitstream 4 is latched in the shift register. It is assumed that output of the configuration bitstream 2 is switched, based on this, G1 is controlled to be turned on, and the configuration bitstream 1 latched in the output latch is over-written into the first latch; G4 is controlled to turned on, and the configuration bitstream 2 latched in the intermediate latch 1 is over-written into the output latch; G3 is controlled to be turned on, and the configuration bitstream 4 latched in the second latch is over-written into the intermediate latch 1; and G2 is controlled to be turned on, the configuration bitstream 1 latched in the first latch is over-written into the second latch. Therefore, the configuration bitstream 1 is latched in the shift register, the configuration bitstream 2 is latched in the output latch, the configuration bitstream 3 is latched in the intermediate latch 2, and the configuration bitstream 4 is latched in the intermediate latch 1, to adjust the latch state of each configuration bitstream, and the output latch can output the configuration bitstream 2. Another latch state of each configuration bitstream may be implemented according to the control logic, and the output latch outputs another configuration bitstream.

In a third embodiment, the multi-bitstream storage configuration bit includes P output latches, where P≥2. The P output latches form a plurality of latch paths, the plurality of latch paths are connected to two terminals of the shift register to form closed loops, and each latch path includes one output latch or a plurality of output latches connected in series. Similar to the second embodiment, there are a plurality of implementations for the latch paths formed by the P output latches at the two terminals of the shift register, and details are not described in this embodiment. For example, there are three output latches, and the three output latches respectively form three latch paths connected to the two terminals of the shift register. In this embodiment, FIG. 6 shows a structure of a multi-bitstream storage configuration bit in this embodiment. The multi-bitstream storage configuration bit further includes an output multiplexer MUX2, output terminals of the P output latches are respectively connected to input terminals of the output multiplexer MUX2, and an output terminal of the output multiplexer MUX2 is connected to a configuration output terminal q of the multi-bitstream storage configuration bit. In this embodiment, the output multiplexer MUX2 may be a multi-input-terminal multiplexer or may be a cascade structure formed by a plurality of multi-input-terminal multiplexers. One configuration bitstream is latched in each output latch, and the multi-bitstream storage configuration bit outputs one configuration bitstream latched in one of the output latches. The bitstream control circuit switches output of different configuration bitstreams by adjusting a latch state of each configuration bitstream and/or adjusting the on state of the output multiplexer.

The bitstream control circuit writes different configuration bitstreams into the output latches through the shift register, write-in controllers are respectively connected among latches connected with each other, and each write-in controller is controlled by the bitstream control circuit. The bitstream control circuit controls a writing and overwriting process between the latches by controlling on states of the write-in controllers, and only one write-in controller is turned on at the same time at most. A writing and download process of the configuration bitstream in this embodiment is similar to the second embodiment, and details are not described in this embodiment again.

In addition, when output of different configuration bitstreams needs to be switched, and if a configuration bitstream latched in another output latch needs to be switched, without adjusting a latch state of each configuration bitstream, the bitstream control circuit can directly adjust an on path of the output multiplexer MUX2 to cause a corresponding output latch to be connected to the configuration output terminal q. Alternatively, a latch state of each configuration bitstream is also adjusted, and a specific adjustment manner is similar to the second embodiment. Details are not described again.

For example, when a configuration bitstream 1 is latched in an output latch 1, a configuration bitstream 2 is latched in an output latch 2, a configuration bitstream 3 is latched in an output latch 3, and a configuration bitstream 4 is latched in the shift register, it is assumed that a current MUX2 is gating and connected to the output latch 1, the multi-bitstream storage configuration bit outputs the configuration bitstream 1. For example, when output of the configuration bitstream 2 needs to be switched, the MUX 2 may be controlled to switch for gating the output latch 2 to switch the output of the configuration bitstream 2 on the basis of remaining a latch state of each current configuration bitstream unchanged. In another example, when the configuration bitstream 4 needs to be switched, the latch state of each configuration bitstream may be adjusted through overwriting between the latches, so that the output latch 1 is adjusted to latch the configuration bitstream 4. In this case, output of the configuration bitstream 4 may be switched on the basis of remaining a gating state of the MUX2 unchanged. Alternatively, in another example, when the configuration bitstream 4 needs to be switched, the latch state of each configuration bitstream may be adjusted through overwriting between the latches, so that the output latch 3 is adjusted to latch the configuration bitstream 4, and the MUX2 is controlled to switch for gating the output latch 3, to switch the output of the configuration bitstream 3.

In a fourth embodiment, similar to the third embodiment, the multi-bitstream storage configuration bit also includes P output latches. Output terminals of the P output latches are respectively connected to input terminals of the output multiplexer MUX2, and an output terminal of the output multiplexer MUX2 is connected to a configuration output terminal q of the multi-bitstream storage configuration bit. In this embodiment, the output multiplexer MUX2 may be a multi-input-terminal multiplexer or may be a cascade structure formed by a plurality of multi-input-terminal multiplexers.

However, different from the third embodiment, the multi-bitstream storage configuration bit further includes M intermediate latches in addition to including the shift register and the P output latches. An input terminal of each intermediate latch is connected to the output terminal of the shift register, and an output terminal of each intermediate latch is connected to the input terminal of the shift register.

All the P output latches and the M intermediate latches form one or more latch paths, the one or more latch paths are connected to two terminals of the shift register to form closed loops, each latch path includes one or more latches connected in series, and a latch on each latch path includes an output latch and/or an intermediate latch. Each latch path is connected to the shift register by different input terminals of the input multiplexer. In this embodiment, the input multiplexer MUX1 may be a multi-input-terminal multiplexer or may be a cascade structure formed by a plurality of multi-input-terminal multiplexers. One configuration bitstream is respectively latched in the shift register, all the P output latches, and the M intermediate latches. Therefore, in this embodiment, a total of P+M+1 configuration bitstreams are latched in the multi-bitstream storage configuration bit.

Similar to the second embodiment and the third embodiment, there are a plurality of implementations for the latch paths formed by the P output latches and the M intermediate latches at the two terminals of the shift register, and FIG. 7 shows an implementation through P=3 and M=3 as an example.

The bitstream control circuit writes different configuration bitstreams into the output latches through the shift register, write-in controllers are respectively connected among latches connected with each other, and each write-in controller is controlled by the bitstream control circuit. The bitstream control circuit controls a writing and overwriting process between the latches by controlling on states of the write-in controllers, and only one write-in controller is turned on at the same time at most. A writing and download process of the configuration bitstream in this embodiment is similar to the second embodiment, and details are not described in this embodiment again. The multi-bitstream storage configuration bit outputs one configuration bitstream latched in one of the output latches. The bitstream control circuit switches output of different configuration bitstreams by adjusting a latch state of each configuration bitstream and/or adjusting the on state of the output multiplexer. An output switching process is similar to the third embodiment, and details are not described in this embodiment.

The dual-bitstream switching function of the FPGA can be implemented in the first embodiment, and more bitstream switching functions can be implemented through various modified structures in the second embodiment, the third embodiment, and the fourth embodiment. In either embodiment, the bitstream control circuit controls the multi-bitstream storage configuration bit to switch the output of different configuration bitstreams at a predetermined time interval or when receiving a predetermined signal. The predetermined signal received by the bitstream control circuit comes from the outside of the FPGA or from the inside of the FPGA. When the predetermined signal comes from the outside of the FPGA, the bitstream control circuit obtains the predetermined signal through a boundary scan circuit. When the predetermined signal comes from the inside of the FPGA, the predetermined signal may be a trigger signal generated after a predetermined task is completed.

In the first embodiment to the fourth embodiment, when a configuration bitstream outputted by the multi-bitstream storage configuration bit is switched, and if logic functions corresponding to two configuration bitstreams outputted by the multi-bitstream storage configuration bit before and after switching respectively belong to different user designs and are independent from each other, the FPGA directly runs the other logic function according to a switched configuration bitstream without being restarted or the FPGA runs the other logic function according to a switched configuration bitstream after being restarted. In this case, no data needs to be transmitted between two different user designs. Therefore, when the FPGA switches running of the logic function corresponding to the other configuration bitstream after being re-started, user data stored in an on-chip storage resource inside the FPGA is reset to a default value during switching, which includes that both a block random access memory (BRAM) and a register are reset to a default value.

In the first embodiment to the fourth embodiment, when a configuration bitstream outputted by the multi-bitstream storage configuration bit is switched and if logic functions corresponding to two configuration bitstreams outputted by the multi-bitstream storage configuration bit before and after switching belong to different parts of an identical user design and have data transmission paths, the FPGA directly runs the other logic function according to a switched configuration bitstream without being restarted, or the FPGA runs the other logic function according to a switched configuration bitstream after being re-started. In this case, data needs to be transmitted between the logic functions before and after switching. Therefore, when the FPGA switches running of logic functions corresponding to different configuration bitstreams, user data stored in an on-chip storage resource inside the FPGA remains unchanged, i.e., a BRAM and a register remain unchanged and may be considered as data transmitted between the two logic functions.

In the first embodiment to the fourth embodiment, after a plurality of downloaded and written configuration bitstreams are latched, the latched configuration bitstreams may be dynamically modified during running of the FPGA in addition to changing latch states of the latched configuration bitstreams, and when the FPGA runs a logic function corresponding to one configuration bitstream latched in the output latch, the bitstream control circuit writes, through the configuration shift chain, a new configuration bitstream to cover another configuration bitstream latched in the multi-bitstream storage configuration bit. For example, in FIG. 2, it is assumed that the configuration bitstream 2 is latched in the output latch, the configuration bitstream 1 is latched in the shift register, and when the FPGA runs a logic function corresponding to the configuration bitstream 2, the bitstream control circuit writes, through the configuration shift chain, a new configuration bitstream 3 to cover the configuration bitstream 1 latched in the shift register, so that the multi-bitstream storage configuration bit is updated to latch the configuration bitstream 2 and the configuration bitstream 3, and then output of the configuration bitstream 2 and the configuration bitstream 3 may be switched.

The FPGA actually includes a plurality of configuration shift chain. All the configuration shift chains in the FPGA are the multi-bitstream configuration shift chain provided in the embodiments of this application; or some configuration shift chains are the multi-bitstream configuration shift chain provided in the embodiments of this application, and the remaining configuration shift chains are a single-bitstream configuration shift chain. One configuration bitstream is latched in a single-bitstream storage configuration bit in the single-bitstream configuration shift chain, and the single-bitstream configuration shift chain is an existing conventional configuration shift chain structure. A specific structure of the single-bitstream configuration shift chain is not described herein.

In addition, it should be noted that in the present application, the multi-bitstream storage configuration bits of various architectures provided in the embodiments can also be compatible with a single-bitstream function, and after controlling to write one configuration bitstream, the bitstream control circuit does not write other configuration bitstreams, and the FPGA is directly started to run.

What is claimed is:

1. A field-programmable gate array (FPGA) for using a configuration shift chain to implement a multi-bitstream function, comprising a bitstream control circuit, a multi-bitstream configuration shift chain and a configurable module, wherein the multi-bitstream configuration shift chain comprises a plurality of multi-bitstream storage configuration bits, and the plurality of multi-bitstream storage configuration bits are sequentially cascaded through a shift write-in terminal and a shift write-out terminal;

each multi-bitstream storage configuration bit of the plurality of multi-bitstream storage configuration bits comprises a shift register, an output latch and an input multiplexer;

an output terminal of the input multiplexer is connected to an input terminal of the shift register, and an output terminal of the shift register is connected to an input terminal of the output latch and the shift write-out terminal of the multi-bitstream storage configuration bit;

an output terminal of the output latch is connected to a configuration output terminal of the multi-bitstream storage configuration bit, and the configuration output terminal is configured to be connected to a configurable module corresponding to the configuration output terminal;

an input terminal of the input multiplexer is connected to the shift write-in terminal of the multi-bitstream storage configuration bit and the output terminal of the output latch; and the bitstream control circuit respectively writes at least two configuration bitstreams into each multi-bitstream storage configuration bit through the multi-bitstream configuration shift chain, the bitstream control circuit respectively latches the at least two configuration bitstreams into the shift register and the output latch by controlling working states of devices in each multi-bitstream storage configuration bit, and then the multi-bitstream configuration shift chain outputs one configuration bitstream of the at least two configuration bitstreams to the configurable module from the configuration output terminal through each multi-bitstream storage configuration bit, wherein the configurable module implements a logic function corresponding to the one configuration bitstream outputted by the multi-bitstream configuration shift chain, and logic functions corresponding to the at least two configuration bitstreams are different.

2. The FPGA according to claim 1, wherein
the multi-bitstream storage configuration bit comprises one output latch, the output terminal of the output latch is directly connected to the configuration output terminal of the multi-bitstream storage configuration bit, the multi-bitstream storage configuration bit outputs one configuration bitstream latched in the output latch, and the bitstream control circuit switches output of different configuration bitstreams by adjusting a latch state of each configuration bitstream.

3. The FPGA according to claim 2, wherein
the input terminal of the output latch is directly connected to the output terminal of the shift register, the output terminal of the output latch is directly connected to the input terminal of the shift register by the input multiplexer, and two configuration bitstreams are latched in the multi-bitstream storage configuration bit.

4. The FPGA according to claim 2, wherein
the multi-bitstream storage configuration bit further comprises M intermediate latches, an input terminal of each intermediate latch of the M intermediate latches is connected to the output terminal of the shift register, an output terminal of each intermediate latch is connected to the input terminal of the shift register, one configuration bitstream is respectively latched in the shift register and all the latches, and all the latches comprise all the output latches and all the intermediate latches; and
all the latches form one or more latch paths, the one or more latch paths are connected to two terminals of the shift register to form closed loops, each latch path of the one or more latch paths comprises one output latch or a plurality of output latches connected in series, and a latch on each latch path comprises the output latch and/or the intermediate latch.

5. The FPGA according to claim 2, wherein
the shift register comprises a first latch and a second latch, an input terminal of the first latch is used as the input terminal of the shift register, an output terminal of the first latch is connected to an input terminal of the second latch, an output terminal of the second latch is used as the output terminal of the shift register, and one configuration bitstream latched in the shift register is latched in both the first latch and the second latch; and
the bitstream control circuit controls the shift register and latches in a closed loop of the shift register to perform mutual writing and overwriting of the configuration bitstreams according to a predetermined sequence, to adjust the latch state of each configuration bitstream.

6. The FPGA according to claim 5, wherein
write-in controllers are respectively connected among the latches connected with each other, each of the write-in controllers is controlled by the bitstream control circuit, the bitstream control circuit controls a writing and overwriting process between the latches by controlling an on state of each of the write-in controllers, and only one write-in controller is turned on at a same time at most.

7. The FPGA according to claim 1, wherein
the multi-bitstream storage configuration bit comprises P output latches, and one configuration bitstream is latched in each output latch of the P output latches; the multi-bitstream storage configuration bit further comprises an output multiplexer, and output terminals of the P output latches are respectively connected to input terminals of the output multiplexer; an output terminal of the output multiplexer is connected to the configuration output terminal of the multi-bitstream storage configuration bit, and the multi-bitstream storage configuration bit outputs one configuration bitstream latched in one of the P output latches; and the bitstream control circuit switches output of different configuration bitstreams by adjusting a latch state of each configuration bitstream and/or adjusting an on state of the output multiplexer, wherein P≥2.

8. The FPGA according to claim 7, wherein
the P output latches form a plurality of latch paths, the plurality of latch paths are connected to two terminals of the shift register to form closed loops, and each latch path of the plurality of latch paths comprises one output latch or a plurality of output latches connected in series.

9. The FPGA according to claim 7, wherein
the multi-bitstream storage configuration bit further comprises M intermediate latches, an input terminal of each intermediate latch of the M intermediate latches is connected to the output terminal of the shift register, an output terminal of each intermediate latch is connected to the input terminal of the shift register, one configuration bitstream is respectively latched in the shift register and all the latches, and all the latches comprise all the output latches and all the intermediate latches; and
all the latches form one or more latch paths, the one or more latch paths are connected to two terminals of the shift register to form closed loops, each latch path of the one or more latch paths comprises one output latch or a plurality of output latches connected in series, and a latch on each latch path comprises the output latch and/or the intermediate latch.

10. The FPGA according to claim 7, wherein
the shift register comprises a first latch and a second latch, an input terminal of the first latch is used as the input terminal of the shift register, an output terminal of the first latch is connected to an input terminal of the second latch, an output terminal of the second latch is used as the output terminal of the shift register, and one configuration bitstream latched in the shift register is latched in both the first latch and the second latch; and
the bitstream control circuit controls the shift register and latches in a closed loop of the shift register to perform mutual writing and overwriting of the configuration bitstreams according to a predetermined sequence, to adjust the latch state of each configuration bitstream.

11. The FPGA according to claim 1, wherein
the bitstream control circuit controls the multi-bitstream storage configuration bit to switch an output of different configuration bitstreams at a predetermined time interval or when receiving a predetermined signal.

12. The FPGA according to claim 11, wherein
the predetermined signal comes from an outside of the FPGA or from an inside of the FPGA.

13. The FPGA according to claim 12, wherein
when the predetermined signal comes from the outside of the FPGA, the bitstream control circuit obtains the predetermined signal through a boundary scan circuit.

14. The FPGA according to claim 1, wherein
when the configuration bitstream outputted by the multi-bitstream storage configuration bit is switched, the FPGA directly runs another logic function according to a switched configuration bitstream, or after being re-started, the FPGA runs another logic function according to a switched configuration bitstream.

15. The FPGA according to claim 1, wherein
logic functions corresponding to two configuration bitstreams outputted by the multi-bitstream storage configuration bit before and after switching respectively belong to different user designs and are independent from each other, and
when the FPGA switches running of a logic function corresponding to the other configuration bitstream after being re-started, user data stored in an on-chip storage resource inside the FPGA is reset to a default value during switching.

16. The FPGA according to claim 1, wherein
logic functions corresponding to two configuration bitstreams outputted by the multi-bitstream storage configuration bit before and after switching belong to different parts of an identical user design and have data transmission paths, and
when the FPGA switches running of logic functions corresponding to different configuration bitstreams, user data stored in an on-chip storage resource inside the FPGA remains unchanged.

17. The FPGA according to claim 1, wherein
when the FPGA runs a logic function corresponding to one configuration bitstream latched in the output latch, the bitstream control circuit writes, through the configuration shift chain, a new configuration bitstream to cover another configuration bitstream latched in the multi-bitstream storage configuration bit.

18. The FPGA according to claim 1, wherein
all configuration shift chains in the FPGA are the multi-bitstream configuration shift chain; or some configuration shift chains are the multi-bitstream configuration shift chain, remaining configuration shift chains are a single-bitstream configuration shift chain, and one configuration bitstream is latched in a single-bitstream storage configuration bit in the single-bitstream configuration shift chain.

* * * * *